United States Patent
Redman-White

(10) Patent No.: US 6,784,741 B1
(45) Date of Patent: Aug. 31, 2004

(54) AMPLIFIER

(75) Inventor: William Redman-White, West Wellow (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 291 days.

(21) Appl. No.: 09/712,677

(22) Filed: Nov. 14, 2000

(30) Foreign Application Priority Data

Dec. 1, 1999 (GB) .............................................. 9928355

(51) Int. Cl.$^7$ .............................. H03G 3/12; H03F 3/45
(52) U.S. Cl. ........................ 330/283; 330/252; 330/254
(58) Field of Search ................................ 330/252, 254, 330/283

(56) References Cited

U.S. PATENT DOCUMENTS

| | | | | |
|---|---|---|---|---|
| 4,361,815 A | * | 11/1982 | Schade, Jr. .................. | 330/254 |
| 5,210,504 A | | 5/1993 | Yagita et al. ................ | 330/253 |
| 5,512,857 A | * | 4/1996 | Koskowich ................. | 330/252 |
| 5,880,631 A | | 3/1999 | Sahota ......................... | 330/51 |
| 6,175,274 B1 | * | 1/2001 | Groe ............................ | 330/51 |
| 6,211,737 B1 | * | 4/2001 | Fong ........................... | 330/282 |
| 6,278,321 B1 | * | 8/2001 | Franck ........................ | 330/254 |

FOREIGN PATENT DOCUMENTS

EP 0587965 A1 3/1994 ............. H03F/1/02

OTHER PUBLICATIONS

By Keng Leong Fong, Entitled: "Dual Bond High–Linearity Variable–Gain Low–Noise Amplifier for Wireless Applications," Published In The Proceedings Of 1999 IEE International Solid State Circuits Conference, pp. 224–225.

* cited by examiner

Primary Examiner—Robert Pascal
Assistant Examiner—Patricia T. Nguyen
(74) Attorney, Agent, or Firm—Aaron Waxler

(57) ABSTRACT

A low noise amplifier with switchable gain settings comprises a cascoded emitter coupled pair (T1, T2, T5, T6; T3, T4, T7, T8) having a current diverter (T9, T10) which reduces the gain to an intermediate level in response to a control signal on terminals (8, 9). Further control signals on terminals (5, 10, 11, 12, 13) reduce the gain to a low level by introducing emitter degeneration (R3). To compensate for the increase in input impedance caused by the introduction of emitter degeneration feedback loops (C1, R8; C2, R9) are connected between the diversion path and the amplifier inputs.

7 Claims, 3 Drawing Sheets

AMPLIFIER

Figure 1:
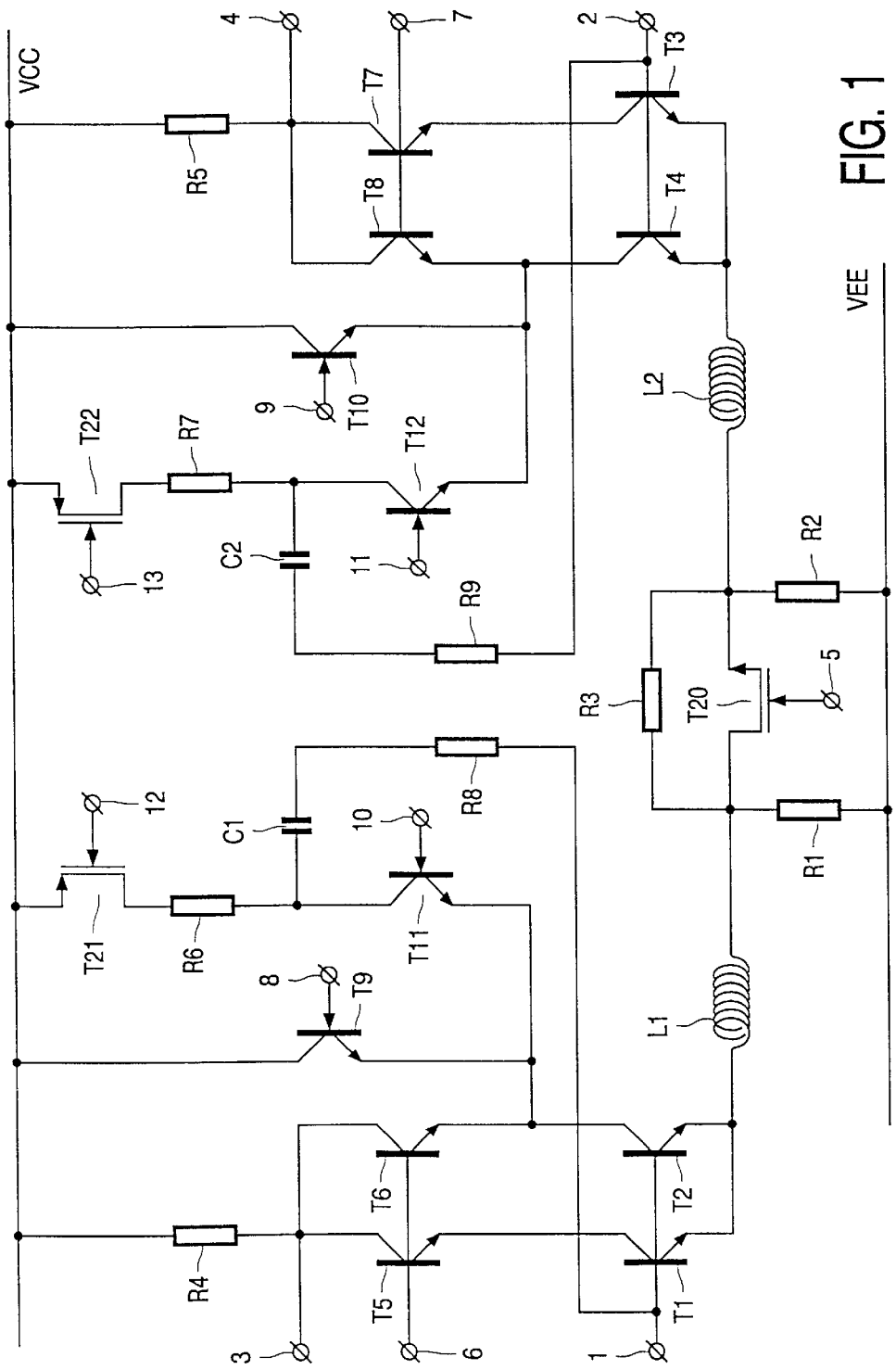

The invention relates to a low noise amplifier having variable gain.

Low noise amplifiers in cellular radios are optimised for a variety of performance and cost trade-offs. Conventionally, these are fixed gain circuits, and the AGC function of the radio is effected in the IF stages. As a result the intermodulation performance of the radio is mainly set by the front end performance, and with a strong signal at the input, the IF stages may well be operating at much reduced gain, but the LNA and mixer may be driven beyond their limits of linearity.

To improve the overall dynamic range of a receiver it would be useful to balance the gain and linearity differently at the input under strong signal conditions. One possibility is to reduce the gain of the LNA. If the input referred third order intermodulation product (IP3) level also goes up when the gain is reduced, then the performance limiting stage is likely to be the mixer. However, if the input referred IP3 level of the LNA is not improved, then the LNA will still generate distortion products before the mixer, and no real improvement in dynamic range will be achieved.

A typical design for a BICMOS LNA with a differential signal path is a simple cascoded common emitter stage. The load may be resistive or inductive or a combination of the two. An inductance in the emitter circuit is advantageous as it raises the real part of the input impedance without increasing noise. This is important as the amplifier in combination with the package lead inductance, must provide a good termination for the off-chip band-select filter. If the match is poor (i.e., with a return loss of more than about −12 dB) the filter function will be affected to an unacceptable degree. If resistive degeneration is used in the emitter circuit, the input capacitance increases as well as the real part, and there is more noise.

In a discrete component LNA gain can be controlled simply by the inclusion of a passive attenuator in the input path. A simple T or π attenuator with PIN switching can produce the effective gain change and keep the match as good or better in the reduced gain state. The signal loss obviously affects the noise figure in the low gain setting but this is not such a big problem. To make this work in a silicon monolithic form is more difficult. MOS switches are apparently ideal for selecting such an attenuation function, but in practice there are big problems. To get a sufficiently low insertion loss the channel resistance must be low compared with 50 Ω (or 100 Ω differential), and so channel widths must be large. Consequently, there will be large capacitances to substrate leading to loss in either the ON or OFF states. Hence the noise figure is poor in the high gain setting.

A known way of controlling the gain in an integrated LNA is to use a current steering architecture as disclosed in a paper entitled "Dual Bond High-Linearity Variable-Gain Low-Noise Amplifier for Wireless Applications," by Keng Leong Fong and published in the Proceedings of 1999 IEEE International Solid State Circuits Conference at pages 224 and 225. The input transistor is split into sections having a ratio related to the attenuation step required. The cascode transistors are also split in the same ratio. One of the paths, however, is provided with a diversion path activated by another cascode operated as a steering switch. The bias on this steering point is switched from about 400 mV below the cascode bias (high gain setting) to about 400 mV above the cascode bias (low gain setting). Hence in the low gain setting only a proportion of the signal current reaches the load. The signal conditions, viewed from the input port, remain the same and so the match to the input is unaltered. At first sign there is no deterioration in noise figure, but in reality the split input transistors act as a differential pair without degeneration in the low gain state, and so some additional noise reaches the output without being cancelled.

This arrangement offers a variable gain without causing the input impedance to change but because the input transistor operating points are essentially unchanged, there is no improvement in the linearity performance. If the mixer input referred third order intermodulation product point is higher than that of the LNA it is still worth having a modest gain step implemented in this way, but for more dynamic range some improvement is desirable.

A possible way of increasing the range of gain control is to use resistive emitter degeneration which can be switched into and out of operation. This, however, has the problem that it alters the input impedance of the amplifier and consequently adversely affects the matching between the RF filter and the amplifier input.

It is an object of the invention to enable the provision of a low noise amplifier in which one or more of the disadvantages discussed above are mitigated.

The invention provides a low noise amplifier having switchable gain settings, the amplifier comprising a cascoded common emitter amplifier stage, a first arrangement for reducing the gain to an intermediate level, said arrangement including a signal diversion path which when activated, causes a portion of the output signal to be diverted from the output and dumped, a second arrangement for reducing the gain to a low value, said second arrangement comprising means for increasing emitter degeneration and means for connecting a shunt feedback path from the diversion path to the input of the amplifier to reduce the increase in input impedance caused by the increase in emitter degeneration.

The common emitter and the cascode may both comprise multiple transistors, said first arrangement comprising means for diverting the current in one of the transistors making up the multiple transistors into the diversion path.

The first arrangement may comprise a further transistor connected to the junction of the common emitter and cascode transistors, said further transistor being operable in an intermediate gain state of the amplifier to conduct the signal current of the one transistor of the common emitter stage to a supply rail.

The second arrangement may comprise a resistor in the emitter circuit of the common emitter transistor and a switch connected in parallel with the resistor, the switch being opened to connect the resistor in the emitter circuit.

The second arrangement may further comprise a still further transistor connected to the junction of the common emitter and cascode transistors, said still further transistor being arranged in the low gain state of the amplifier to apply the output current of the one common emitter transistor to an internal load, a feedback path being provided between the internal load and the input of the amplifier.

An amplifier according to the invention has several advantages. First, because the feedback network is connected from an amplified output, the resistors used can have a resistance several times larger than those needed in a termination connected to ground and hence their intrinsic noise contribution is lower. Secondly, if the network contains larger value resistors the MOS switches can be physically smaller, since their ON resistance needs only to be low in comparison with the resistors and not the absolute input impedance. Consequently, their parasitic capacitance to ground is lower making the path for noise in the OFF state less significant. Thirdly, by using the dummy output to drive the feedback path there is no other loading at this point and the gain and phase are not affected by the load presented by the input capacitance of the following circuit (as is the main output). A further advantage of this approach is that the variable gain and improved linearity are obtained with no significant additional power consumption. Only some bias for the current steering path needed.

The low noise amplifier may comprise a differential pair. This enables the production of a differential amplifier using the same inventive principle. This will, of course, mean that the various diversion means and feedback paths are duplicated.

Figure 2:
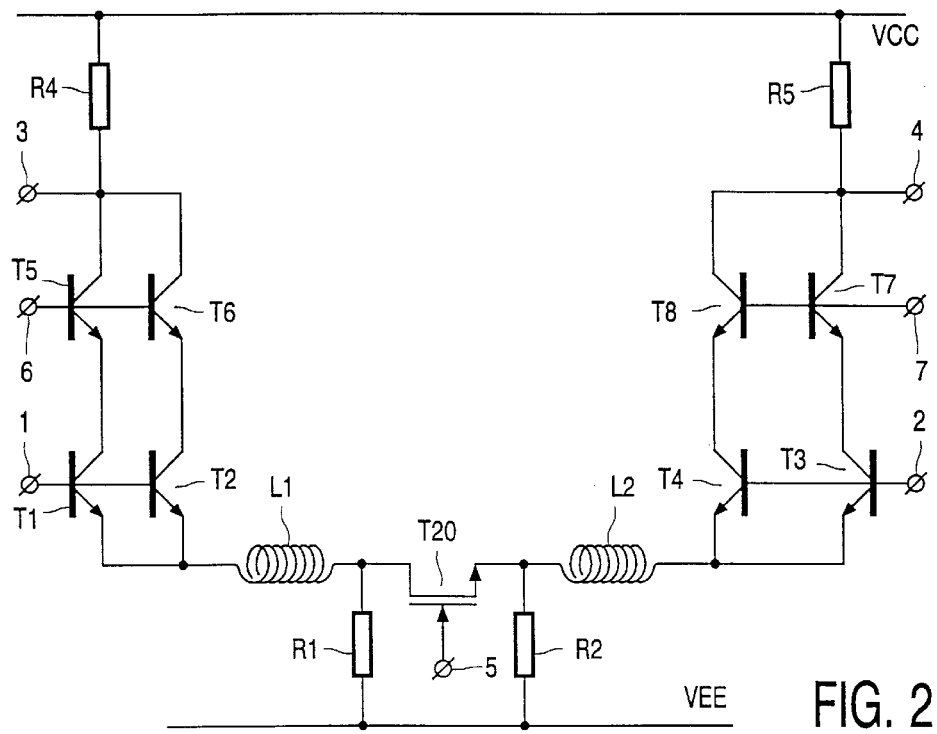
Figure 3:
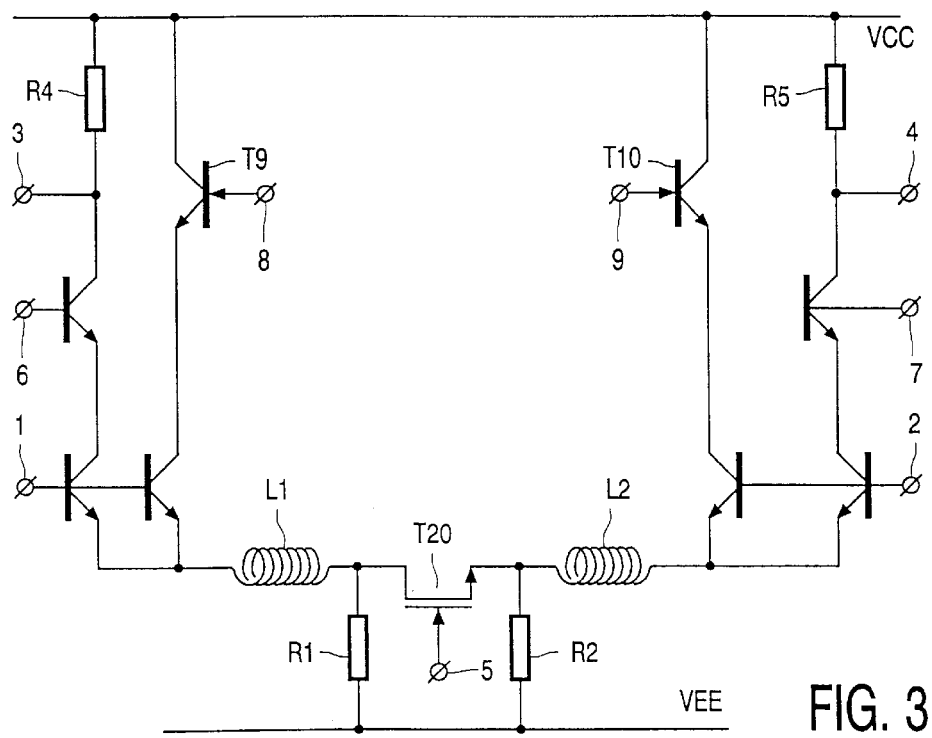
Figure 4:
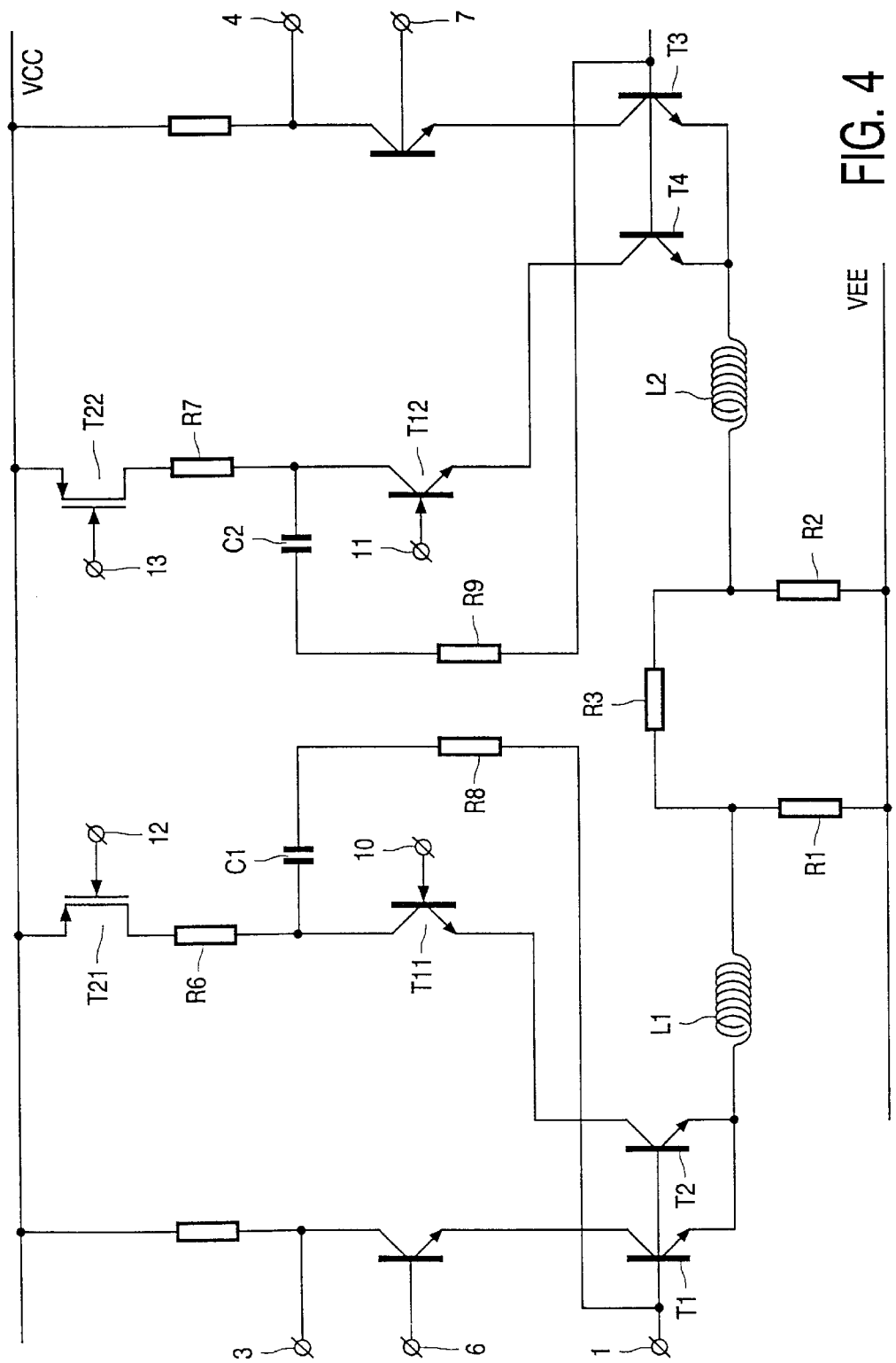

The above and other features and advantages of the invention will be apparent from the following description, by way of example, of an embodiment of the invention with reference to the accompanying drawings, in which:

FIG. 1 is a circuit diagram of one embodiment of a low noise amplifier according to the invention, and FIGS. 2 to 4 illustrate those parts of the amplifier shown in FIG. 1 which are active in the various gain steps of the amplifier.

FIG. 1 shows a circuit diagram of a low noise amplifier according to the invention in the form of a differential amplifier having first and second inputs 1 and 2 for receiving an RF input signal and first and second outputs 3 and 4 for delivering an amplified RF output signal. The input 1 is connected to the base electrodes of two NPN transistors T1 and T2, while the input 2 is connected to the base electrodes of two NPN transistors T3 and T4. The emitters of transistors T1 and T2 are connected via an inductor L1 and a resistor R1 to a supply rail VEE. The emitters of transistors T3 and T4 are connected via an inductor L2 and resistor R2 to the supply rail VEE. The junction of inductor L1 and resistor R1 is connected to the junction of inductor L2 and resistor R2 via a further resistor R3. An N-channel field effect transistor T20 has its source and drain electrodes connected across the resistor R3 and its gate electrode connected to a terminal 5. The collectors of transistors T1 and T2 are connected to the emitters of two NPN transistors T5 and T6 whose bases are connected to a terminal 6. The collectors of transistors T5 and T6 are connected to the output 3 and via a resistor R4 to a supply rail VCC. The collectors of transistors T3 and T4 are connected to the emitter of corresponding NPN transistors T7 and T8 whose collectors are connected to the output 4 and via a resistor R5 to the supply rail VCC. The bases of transistors T7 and T8 are connected to a terminal 7.

The junction of the collector of transistor T2 and the emitter of transistor T6 is connected to the emitter of an NPN transistor T9. The collector of transistor T9 is connected to the supply rail VCC while its base is connected to a terminal 8. Similarly, the junction of the collector of transistor T4 and emitter of transistor T8 is connected to the emitter of an NPN transistor T10. The collector of transistor T10 is connected to the supply rail VCC and the base of transistor T10 is connected to a terminal 9. It will be apparent that transistors T9 and T10 form respective output signal diversion paths when conducting and under these circumstances the contributions of transistors T2 and T4 to the output signal is eliminated thus reducing the effective gain of the amplifier by a factor dependent on the ratio of transistors T1 to T2 and T3 to T4.

The collector of transistor T2 is further connected to the emitter of an NPN transistor T11 whose base is connected to a terminal 10. Similarly, the collector of transistor T4 is further connected to the emitter of an NPN transistor T12 whose base is connected to a terminal 11. The collector of transistor T11 is connected via the series arrangement of a resistor R6 and the drain source path of a P-channel field effect transistor T21 to the supply rail VCC. Similarly the collector of transistor T12 is connected via the series arrangement of a resistor R7 and the drain-source path of a P-channel field effect transistor T22 to the supply VCC. The gate electrode of transistor T21 is connected to a terminal 12 while the gate electrode of transistor T22 is connected to a terminal 13. The junction of the collector of transistor T11 and resistor R6 is connected via the series arrangement of a capacitor C1 and a resistor R8 to the base of transistor T1 while the junction of the collector of transistor T12 and resistor R7 is connected via the series arrangement of a capacitor C2 and resistor R9 to the base of transistor T3. It will be apparent that when transistors T11, T12, T21, and T22 are conducting (and transistors T9 and T10 non conducting) then transistors T11 and T12 divert the signal current of transistors T2 and T4 to the supply rails (via resistors R6 and R7 and transistors T21 and T22) and that this portion of the output signal is fed back to the inputs 1 and 2 via the networks C1 and R8 and C2 and R9.

In order to adjust the gain of the amplifier, appropriate potentials are applied to terminals 5, 8, 9, 10, 11, 12 and 13. Terminals 6 and 7 are fed with a constant bias potential to appropriately bias the cascode transistors T5, T6, T7 and T8.

FIG. 2 illustrates those parts of the amplifier which are active when in its maximum gain state. In this state the transistor T20 is switched on by applying a potential of VCC to terminal 5 so that it shorts out the degeneration resistor R3 and transistors T9, T10, T11 and T12 are switched off by applying a potential of ($V_{bias}$–0.4V) to terminals 8, 9, 10 and 11 respectively, where $V_{bias}$ is the potential applied to the cascode transistors T6 and T8 via terminals 6 and 7, and transistors T21 and T22 are switched off by applying a potential of VCC to terminals 12 and 13. This disables the current diversion and the feedback path. Thus as shown in FIG. 2 the amplifier is a conventional low noise amplifier of differential form with no output current diversion and no feedback apart from inductive degeneration.

FIG. 3 shows those parts of the amplifier which are active when it is in a medium gain configuration. Under these conditions current diversion from the output is activated but the degeneration resistor R3 is still short circuited by the transistor T20. Thus a potential of ($V_{bias}$+0.4V) is applied at terminals 8 and 9 so that transistors T9 and T10 are turned on and they divert the output signal from transistors T6 and T8 to the supply rail. As a result the effective gain of the amplifier is reduced since part of the output signal is diverted and dumped into the power supply. Transistors T11, T12, T21 and T22 remain turned off as the potential VCC is retained at terminals 12 and 13 and the potential ($V_{bias}$–0.4V) is maintained at terminals 10 and 11.

FIG. 4 shows those parts of the amplifier which are active when it is in a low gain configuration. In this case a potential of VEE is applied to terminal 5 so that transistor T20 is turned off and hence the degeneration resistor R3 is switched in to the circuit, lowering the gain of the amplifier still further. A potential of ($V_{bias}$–0.4V) is applied to terminals 8 and 9 so that transistors T9 and T10 are switched off while a potential of ($V_{bias}$+0.4V) is applied to terminals 10 and 11 and a potential of VEE is applied to terminals 12 and 13 so that transistors T11, T12, T21 and T22 are all switched on. Thus a portion of the output signal is diverted through transistor T11 and T21 to the supply and similarly through T12 and T22 to the supply. It will be apparent to the person skilled in the art that the insertion of the degeneration resistor R3 will cause the input impedance to increase and to compensate for this part of the dumped output signal which passes through resistor R6 to the supply rail VCC is fed back via the feedback paths comprising capacitor C1 and resistor R8 and capacitor C2 and resistor R9 to the inputs of the amplifier. These shunt feedback paths will reduce the input impedance of the amplifier, thus compensating for the increase in input impedance caused by the insertion of the degeneration resistor R3. Thus the effect of the feedback loops is to maintain the input impedance substantially constant.

As has been stated earlier because the feedback network is connected to an amplified output the load resistors R6 and R7 can be several times bigger than that which would be needed in a termination connected to ground and hence their intrinsic noise contribution is lower. Additionally, since the resistors R6 and R7 are larger the MOS switches T21 and T22 can be smaller since their on resistance needs only to be low in comparison with that of the resistors R6 and R7 and not in comparison with the input impedance. Making the MOS transistors smaller causes the parasitic capacitance to ground to be smaller so that the path for noise when the MOS transistor is switched off less significant. Additionally by using the dummy output to drive the feedback path there is no loading at this point other than the resistors R6 and R7. This gives the advantage that the gain and phase response are not affected by any load presented to the main output. It will be appreciated that when such an amplifier is loaded by the mixer then the mixer input capacitance will have an effect on the gain and phase of the output.

It will be clear that although the invention has been described in this embodiment with reference to a differential amplifier this is by no means essential. The amplifier disclosed in this in the paper by Keng Leong Fong referred to earlier is a single ended amplifier and the feedback techniques used in the differential amplifier disclosed in this application can be applied equally to an amplifier such as that disclosed in the paper referred to. Effectively this would involve providing only one half of the circuit shown in FIG. 1

From reading the present disclosure, other modifications will be apparent to persons skilled in the art. Such modifications may involve other features which are already known in the design and use of amplifiers and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A low noise amplifier having switchable gain settings, the amplifier comprising a cascoded common emitter amplifier stage, a first arrangement for reducing the gain to an intermediate level, said arrangement including a signal diversion path which, when activated, causes a portion of the output signal to be diverted from the output and dumped, a second arrangement for reducing the gain to a low value, said second arrangement comprising means for increasing emitter degeneration and means for connecting a shunt feedback path from the diversion path to the input of the amplifier to reduce the increase in input impedance caused by the increase in emitter degeneration.

2. A low noise amplifier as claimed in claim 1 in which the common emitter and the cascode both comprise multiple transistors and said first arrangement comprises means for diverting the current in one of the transistors making up the multiple transistors into the diversion path.

3. A low noise amplifier as claimed in claim 2 in which said first arrangement comprises a further transistor connected to the junction of the common emitter and cascode transistors, said further transistor being operable in an intermediate gain state of the amplifier to conduct the signal current of the one transistor of the common emitter stage to a supply rail.

4. A low noise amplifier as claimed in claim 1 in which said second arrangement comprises a resistor in the emitter circuit of the common emitter transistor and a switch connected in parallel with the resistor, the switch being opened to connect the resistor in the emitter circuit.

5. A low noise amplifier as claimed in claim 4 in which said second arrangement further comprises a still further transistor connected to the junction of the common emitter and cascode transistors, said still further transistor being arranged in the low gain state of the amplifier to apply the output current of the one common emitter transistor to an internal load, a feedback path being provided between the internal load and the input of the amplifier.

6. A low noise amplifier claim 1 in which inductive degeneration is provided in the emitter circuit.

7. A low noise amplifier as claimed in claim 1 wherein the common emitter amplifier comprises a differential pair.

* * * * *